(12) United States Patent
Kobayashi

(10) Patent No.: US 6,288,615 B1
(45) Date of Patent: Sep. 11, 2001

(54) SWITCH-TYPE OSCILLATING CIRCUIT FOR PROVIDING ISOLATION BETWEEN FIRST AND SECOND OSCILLATING CIRCUITS

(75) Inventor: Hiroki Kobayashi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/602,126

(22) Filed: Jun. 23, 2000

(30) Foreign Application Priority Data

Jun. 25, 1999 (JP) ................................................ 11-180705

(51) Int. Cl.[7] ........................................................ H03B 5/12
(52) U.S. Cl. .......................... 331/49; 331/77; 331/117 R; 331/173; 331/177 V
(58) Field of Search .......................... 331/49, 77, 117 R, 331/117 FE, 117 D, 116 R, 116 FE, 173, 177 V

(56) References Cited

U.S. PATENT DOCUMENTS 5,200,713 * 4/1993 Grace et al. ............................ 331/49

FOREIGN PATENT DOCUMENTS 10-126152  5/1998 (JP) .
11-298242  10/1999 (JP) .

* cited by examiner

*Primary Examiner*—David Mis
(74) *Attorney, Agent, or Firm*—Brinks Hofer Gilson & Lione

(57) ABSTRACT

A switch-type oscillating circuit includes a first oscillating circuit for outputting an oscillation signal having a first frequency, which includes a first oscillation transistor and a first switch circuit for turning on and off the first oscillation transistor; a second oscillating circuit for outputting an oscillation signal having a second frequency, which includes a second oscillation transistor and a second switch circuit for turning on and off the second oscillation transistor; and a coupling circuit disposed between the output end of the first oscillating circuit and the output end of the second oscillating circuit, and the input end of a common circuit. A first low-pass filter circuit is connected between the output end of the first oscillating circuit and a common potential point, for attenuating the oscillation signal having the second frequency; and a second low-pass filter circuit is connected between the output end of the second oscillating circuit and the common potential point, for attenuating the oscillation signal having the first frequency.

3 Claims, 3 Drawing Sheets

SWITCH-TYPE OSCILLATING CIRCUIT FOR PROVIDING ISOLATION BETWEEN FIRST AND SECOND OSCILLATING CIRCUITS

BACKGROUND OF THE INVENTION

1. Field of the Invention

The present invention relates to switch-type oscillating circuits, and more particularly, to a switch-type oscillating circuit in which switch circuits selectively switch one of two oscillating circuits to an operating state and sufficient isolation is provided between the two oscillating circuits when the output ends of the two oscillating circuits are coupled with the input end of a common circuit through a coupling circuit.

2. Description of the Related Art

As mobile communication systems used in the world, there are a digital cellular system (DCS) used in Great Britain, Germany, Italy, France, and a part of Asian nations, and a global system for mobile communications (GSM), which was adopted in 1982 as the European integrated standard method for digital portable telephones, used in Europe, the United States of America, Africa, and a part of Asian nations.

In the DCS, a local-station frequency is assigned to 1805 MHz to 1880 MHz, a mobile-station frequency is assigned to 1710 MHz to 1785 MHz, the oscillation frequency of a voltage-controlled oscillating circuit (VCO) in a portable telephone is assigned to the 1700 MHz band, the number of used channels is 374, and the Gaussian minimum shift keying (GMSK) modulation method is used. In the GSM, a local-station frequency is assigned to 925 MHz to 960 MHz, a mobile-station frequency is assigned to 880 MHz to 915 MHz, the oscillation frequency of a voltage-controlled oscillating circuit (VCO) in a portable telephone is assigned to the 900 MHz band, the number of used channels is 124, and the Gaussian minimum shift keying (GMSK) modulation method is used.

Since these two mobile communication systems, the DCS and the GSM, are essentially different in method, it is necessary to use two portable telephones, one for mobile communication in the DCS and the other for mobile communication in the GSM, to subscribe to the two mobile communication systems.

Because the DCS and the GSM use the GMSK modulation method, as described above, and only differ in assigned frequency, a portable telephone which can be used both in the DCS and the GSM has already been proposed, provided with a switch-type oscillating circuit which includes two voltage-controlled oscillating circuits, a first voltage-controlled oscillating circuit for oscillating at a frequency of the 1700 MHz band and a second voltage-controlled oscillating circuit for oscillating at a frequency of the 900 MHz band, and switch circuits; and in which the two voltage-controlled oscillating circuits are selectively used under the control of the switch circuits.

When this portable telephone, which can be used both in the DCS and the GSM, is used for mobile communication in the DCS, the switch circuits switch the first voltage-controlled oscillating circuit to an operating state and the second voltage-controlled oscillating circuit to a non-operating state so as to obtain an oscillation output from the first voltage-controlled oscillating circuit. When the portable telephone is used for mobile communication in the GSM, the switch circuits switch the first voltage-controlled oscillating circuit to a non-operating state and the second voltage-controlled oscillating circuit to an operating state so as to obtain an oscillation output from the second voltage-controlled oscillating circuit.

FIG. 3 is a circuit diagram showing an example structure of a known switch-type oscillating circuit in a portable telephone which can be used both in the DCS and the GSM.

As shown in FIG. 3, the known switch-type oscillating circuit is provided with a first voltage-controlled oscillating circuit 31 for oscillating at a frequency of the 1700 MHz band, a second voltage-controlled oscillating circuit 32 for oscillating at a frequency of the 900 MHz band, a coupling circuit 33, a common circuit 34, a first-oscillation-signal output terminal 35, a second-oscillation-signal output terminal 36, a common input terminal 37, a signal output terminal 38, a first-switch-signal supply terminal 39, a second-switch-signal supply terminal 40, a power terminal 41, a first-frequency-setting-voltage supply terminal 42, and a second-frequency-setting-voltage supply terminal 43.

The first voltage-controlled oscillating circuit 31 is formed of a first oscillation transistor $31_1$, a first switching transistor $31_2$, an emitter load resistor $31_3$, an isolation inductor $31_4$, a varactor diode $31_5$, an inductor $31_6$, a bypass capacitor $31_7$, resonant capacitors $31_8$ and $31_{10}$, a resonant inductor $31_9$, base bias resistors $31_{11}$, and $31_{12}$, feedback capacitors $31_{13}$ and $31_{14}$, a series resistor $31_{15}$, and a grounding capacitor $31_{16}$. These circuit elements $31_1$, to $31_{16}$ are connected as shown in FIG. 3.

The first switching transistor $31_2$ constitutes a first switch circuit, goes on when a first switch signal sent to the first-switch-signal supply terminal 39 has a positive polarity (high level), and goes off when the first switch signal has a ground potential (low level). The varactor diode $31_5$, the resonant inductor $31_9$, and the resonant capacitors $31_8$ and $31_{10}$, constitute a first resonant circuit for specifying the first oscillation frequency of the first voltage-controlled oscillating circuit 31. The resonant frequency of the first resonant circuit is set to a predetermined frequency in the 1700 MHz band by changing a first frequency setting voltage sent to the varactor diode $31_5$ through the first-frequency-setting-voltage supply terminal 42.

The second voltage-controlled oscillating circuit 32 has almost the same structure as the first voltage-controlled oscillating circuit 31, and is formed of a second oscillation transistor $32_1$, a second switching transistor $32_2$, an emitter load resistor $32_3$, an isolation inductor $32_4$, a varactor diode $32_5$, an inductor $32_6$, a bypass capacitor $32_7$, resonant capacitors $32_8$ and $32_{10}$, a resonant inductor $32_9$, base bias resistors $32_{11}$ and $32_{12}$, feedback capacitors $32_{13}$ and $32_{14}$, a series resistor $32_{15}$, and a grounding capacitor $32_{16}$. These circuit elements $32_1$ to $32_{16}$ are connected as shown in FIG. 3.

The second switching transistor $32_2$ constitutes a second switch circuit, goes on when a second switch signal sent to the second-switch-signal supply terminal 40 has a positive polarity (high level), and goes off when the second switch signal has a ground potential (low level). The varactor diode $32_5$, the resonant inductor $32_9$, and the resonant capacitor $32_8$ and $32_{10}$, constitute a second resonant circuit for specifying the second oscillation frequency of the second voltage-controlled oscillating circuit 32. The resonant frequency of the second resonant circuit is set to a predetermined frequency in the 900 MHz band by changing a second frequency setting voltage sent to the varactor diode $32_5$ through the second-frequency-setting-voltage supply terminal 43.

The coupling circuit 33 is formed of a first coupling capacitor $33_1$, an inductor $33_2$, a capacitor $33_3$, a second coupling capacitor $33_4$, an inductor $33_5$, and a capacitor $33_6$. These circuit elements $33_1$ to $33_6$ are connected as shown in FIG. 3. The inductor $33_2$ and the capacitor $33_3$ form a first trap circuit which resonates at the second oscillation frequency of the second voltage-controlled oscillating circuit 32. The inductor $33_5$ and the capacitor $33_3$ form a second trap circuit which resonates at the first oscillation frequency of the first voltage-controlled oscillating circuit 31. The coupling circuit 33 provides sufficient isolation between the first voltage-controlled oscillating circuit 31 and the second voltage-controlled oscillating circuit 32 since the first trap circuit and the second trap circuit are connected as shown in FIG. 3.

The common circuit 34 is formed of an amplifying transistor $34_1$, a collector load inductor $34_2$, an emitter resistor $34_3$, a grounding capacitor $34_4$, base bias resistors $34_5$ and $34_6$, impedance-matching capacitors $34_7$ and $34_8$, and a bypass capacitor $34_9$. These circuit elements $34_1$ to $34_9$ are connected as shown in FIG. 3.

The switch-type oscillating circuit having the above structure operates in the following way.

When the portable telephone is used for mobile communication in the DCS, a control section (not shown) sends a first switch signal having the positive polarity (high level) to the first-switch-signal supply terminal 39 and a second switch signal having the ground potential (low level) to the second-switch-signal supply terminal 40 to turn on the first switching transistor $31_2$ and to turn off the second switching transistor $32_2$. In the first voltage-controlled oscillating circuit 31, the ground end of the emitter load $31_3$ of the first oscillation transistor $31_1$ is connected to the ground through the collector-emitter path of the first switching transistor $31_2$, which is on, an operation current flows between the collector and the emitter of the first oscillation transistor $31_1$, and a normal oscillation operation is achieved. On the other hand, in the second voltage-controlled oscillating circuit 32, the ground end of the emitter load $32_3$ of the second oscillation transistor $32_1$ is not connected to the ground because the second switching transistor $32_2$ is off. Therefore, an operation current does not flow between the collector and the emitter of the second oscillation transistor $32_1$, and an oscillation operation is not achieved.

An oscillation signal (at a frequency in the 1700 MHz band) obtained by the first oscillation transistor $31_1$ is sent from the emitter thereof to the coupling circuit 33 through the first-oscillation-signal output terminal 35, and then is sent to the common input terminal 37 of the common circuit 34 through the first coupling capacitor $33_1$, and the first trap circuit formed of the elements $33_2$ and $33_3$ in the coupling circuit 33. Then, the oscillation signal is amplified by the amplifying transistor $34_1$ in the common circuit 34, and the amplified oscillation signal is sent through the signal output terminal 38 to a circuit (not shown) which uses the oscillation signal.

When the portable telephone is used for mobile communication in the GSM, the control section sends a first switch signal having the ground potential (low level) to the first-switch-signal supply terminal 39 and a second switch signal having the positive polarity (high level) to the second-switch-signal supply terminal 40 to turn off the first switching transistor $31_2$ and to turn on the second switching transistor $32_2$. In the second voltage-controlled oscillating circuit 32, the ground end of the emitter load $32_3$ of the second oscillation transistor $32_1$ is connected to the ground through the collector-emitter path of the second switching transistor $31_2$, which is on, an operation current flows between the collector and the emitter of the second oscillation transistor $32_1$, and a normal oscillation operation is achieved. On the other hand, in the first voltage-controlled oscillating circuit 31, the ground end of the emitter load $31_3$ of the first oscillation transistor $31_1$ is not connected to the ground because the first switching transistor $31_2$ is off. Therefore, an operation current does not flow between the collector and the emitter of the first oscillation transistor $31_1$, and an oscillation operation is not achieved.

An oscillation signal (at a frequency in the 900 MHz band) obtained by the second oscillation transistor $32_1$ is sent from the emitter thereof to the coupling circuit 33 through the second-oscillation-signal output terminal 36, and then is sent to the common input terminal 37 of the common circuit 34 through the second coupling capacitor $33_4$ and the second trap circuit formed of the elements $33_5$ and $33_6$ in the coupling circuit 33. Then, in the same way as described above, the oscillation signal is amplified by the amplifying transistor $34_1$ in the common circuit 34, and the amplified oscillation signal is sent through the signal output terminal 38 to a circuit (not shown) which uses the oscillation signal.

As described above, in the known switch-type oscillating circuit, the first switch signal and the second switch signal, which are complementary, are sent to selectively make the first voltage-controlled oscillating circuit 31 or the second voltage-controlled oscillating circuit 12 operate. The oscillation signal obtained by the operating voltage-controlled oscillating circuit is sent to the common circuit 34 through the coupling circuit 33.

In the known switch-type oscillating circuit, the first and second switch signals, which are complementary, are sent to make one voltage-controlled oscillating circuit, for example, the first voltage-controlled oscillating circuit 31, oscillate, and to make the other voltage-controlled oscillating circuit, for example, the second voltage-controlled oscillating circuit 32, not oscillate. The coupling circuit 33 having the first and second trap circuits provides sufficient isolation between the first-frequency oscillation signal obtained by the first voltage-controlled oscillating circuit 31 and the second-frequency oscillation signal obtained by the second voltage-controlled oscillating circuit 32. Since the first trap circuit is connected in series to the transmission line of the first-frequency oscillation signal and the second trap Circuit is connected in series to the transmission path of the second-frequency oscillation signal, however, the first trap circuit serves as a load for the first-frequency oscillation signal at a path from the input terminal 35 of the first trap circuit through the coupling circuit 33 to the common input terminal 37 of the common circuit 34, and the first-frequency oscillation signal is attenuated. The second trap circuit also serves as a load for the second-frequency oscillation signal at a path from the input terminal 36 of the second trap circuit through the coupling circuit 33 to the common input terminal 37 of the common circuit 34, and the second-frequency oscillation signal is also attenuated.

SUMMARY OF THE INVENTION

The present invention has been made in consideration of the above technical situation. Accordingly, it is an object of the present invention to provide a switch-type oscillating circuit which provides sufficient isolation between two oscillating circuits when the two oscillating circuits are connected to a common circuit through a coupling circuit and which reduces the attenuation of the signals having first and second frequencies output from the two oscillating circuits.

The foregoing object is achieved in the present invention through the provision of a switch-type oscillating circuit including a first oscillating circuit for outputting an oscillation signal having a first frequency, including a first oscillation transistor and a first switch circuit for switching the first oscillation transistor between an operating state and a non-operating state; a second oscillating circuit for outputting an oscillation signal having a second frequency, including a second oscillation transistor and a second switch circuit for switching the second oscillation transistor between an operating state and a non-operating state; a coupling circuit disposed between the output end of the first oscillating circuit and the output end of the second oscillating circuit, and the input end of a common circuit; a first low-pass filter circuit connected between the output end of the first oscillating circuit and a common potential point, for attenuating the oscillation signal having the second frequency; and a second low-pass filter circuit connected between the output end of the second oscillating circuit and the common potential point, for attenuating the oscillation signal having the first frequency.

The above structure may be configured such that the first switch circuit and the second switch circuit are connected to the output-current path of the first oscillation transistor and the output-current path of the second oscillation transistor.

The above structure may be configured such that the first switch circuit and the second switch circuit are connected to the emitter of the first oscillation transistor and the emitter of the second oscillation transistor.

According to the above structure, since the first low-pass filter for attenuating the oscillation signal having the second frequency generated by the second oscillating circuit is connected between the output end of the first oscillating circuit and the common potential point in the first oscillating circuit, and the second low-pass filter for attenuating the oscillation signal having the first frequency generated by the first oscillating circuit is connected between the output end of the second oscillating circuit and the common potential point in the second oscillating circuit, the attenuation of the oscillation signals having the first frequency and the second frequency is reduced when they are transferred, while sufficient isolation is obtained between the oscillation signals.

In addition, according to the above structure, the first low-pass filter and the second low-pass filter need to be designed mainly with their attenuation frequencies only being taken into consideration. Therefore, the first low-pass filter and the second low-pass filter can be easily designed while sufficient isolation is obtained between the oscillation signal having the first frequency output from the first oscillating circuit and the oscillation signal having the second frequency output from the second oscillating circuit.

DESCRIPTION OF THE PREFERRED EMBODIMENTS

Figure 1:
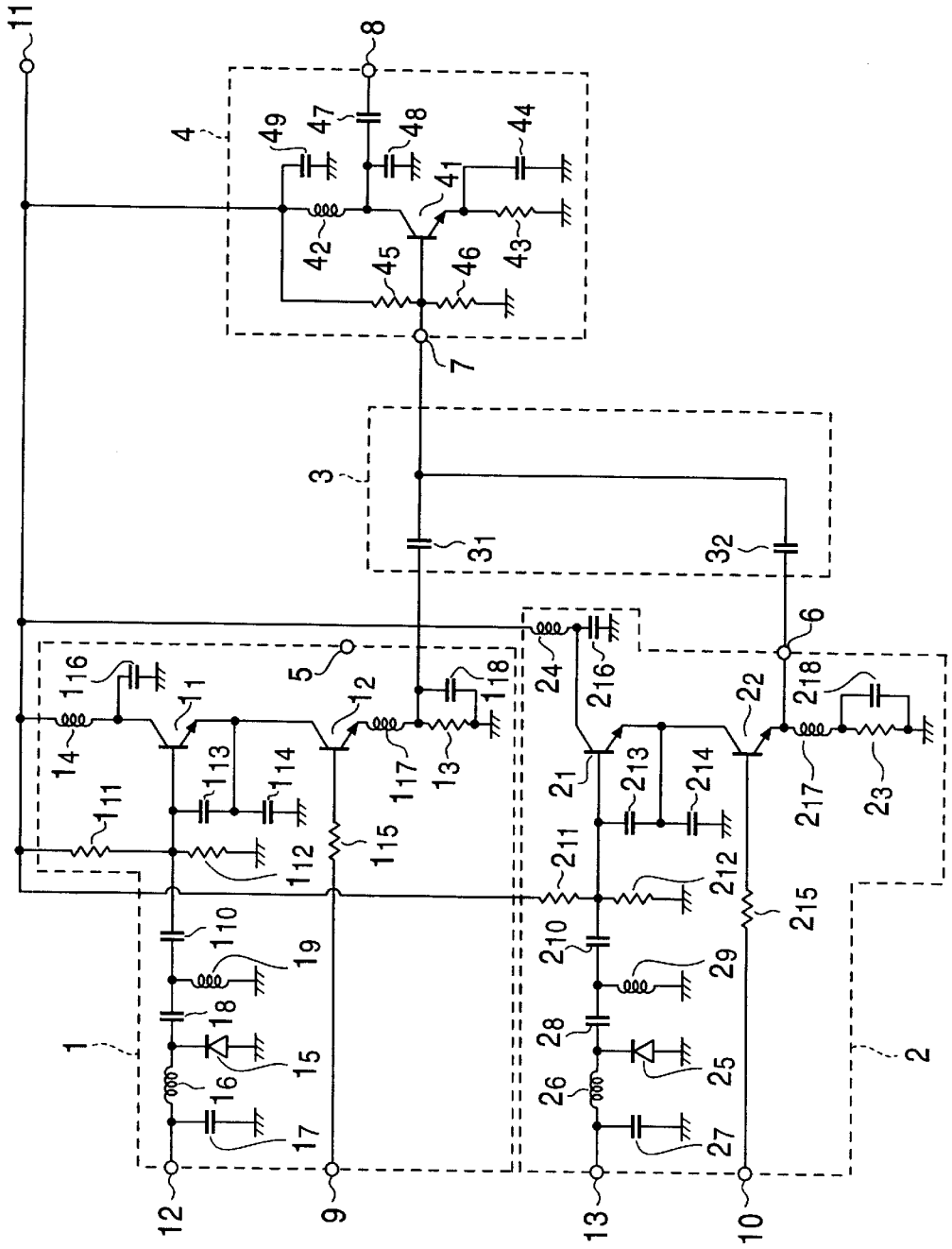
FIG. 1 is a circuit diagram of a switch-type oscillating circuit according to a first embodiment of the present invention.

Embodiments of the present invention will be described below by referring to the drawings.

FIG. 1 is a circuit diagram of a switch-type oscillating circuit according to a first embodiment of the present invention. The switch-type oscillating circuit is used for a portable telephone which can be used both in the DCS and the GSM.

As shown in FIG. 1, the switch-type oscillating circuit according to the first embodiment is provided with a first voltage-controlled oscillating circuit 1 for oscillating at a frequency of the 1700 MHz band, a second voltage-controlled oscillating circuit 2 for oscillating at a frequency of the 900 MHz band, a coupling circuit 3, a common circuit 4, a first-oscillation-signal output terminal 5, a second-oscillation-signal output terminal 6, a common input terminal 7, a signal output terminal 8, a first-switch-signal supply terminal 9, a second-switch-signal supply terminal 10, a power terminal 11, a first-frequency-setting-voltage supply terminal 12, and a second-frequency-setting-voltage supply terminal 13.

The first voltage-controlled oscillating circuit 1 is formed of a first oscillation transistor $1_1$, a first switching transistor $1_2$, an emitter load resistor $13_1$, an isolation inductor $1_4$, a varactor diode $1_5$, an inductor $1_6$, a bypass capacitor $1_7$, resonant capacitors $1_8$ and $1_{10}$, a resonant inductor $1_9$, base bias resistors $1_{11}$ and $1_{12}$, feedback capacitors $1_{13}$ and $1_{14}$, a series resistor $1_{15}$, a grounding capacitor $1_{16}$, an inductor $1_{17}$ for an LPF circuit, and a capacitor $1_{18}$ for the LPF circuit. These circuit elements $1_1$ to $1_{18}$ are connected as shown in FIG. 1.

The first switching transistor $1_2$ constitutes a first switch circuit, goes on when a first switch signal sent to the first-switch-signal supply terminal 9 has a positive polarity (high level), and goes off when the first switch signal has a ground potential (low level). The varactor diode $1_5$, the resonant inductor $1_9$, and the resonant capacitors $1_8$ and $1_{10}$ constitute a first resonant circuit for specifying the first oscillation frequency of a signal generated by the first voltage-controlled oscillating circuit 1. The resonant frequency of the first resonant circuit is set to a predetermined frequency in the 1700 MHz band by changing a first frequency setting voltage sent to the varactor diode $1_5$ through the first-frequency-setting-voltage supply terminal 12. The inductor 1,7 and the capacitor $1_{18}$ form a first LPF circuit for attenuating the second oscillation frequency of a signal generated by the second voltage-controlled oscillating circuit 2.

The second voltage-controlled oscillating circuit 2 has almost the same structure as the first voltage-controlled oscillating circuit 1, and is formed of a second oscillation transistor $2_1$, a second switching transistor $2_2$, an emitter load resistor $2_3$, an isolation inductor $2_4$, a varactor diode $2_5$, an inductor $2_6$, a bypass capacitor $2_7$, resonant capacitors $2_8$ and $2_{10}$, a resonant inductor $2_9$, base bias resistors $2_{11}$ and $2_12$, feedback capacitors $2_{13}$ and $2_{14}$, a series resistor $2_{15}$, a grounding capacitor $2_{16}$, an inductor $2_{17}$ for a LPF circuit, and a capacitor $2_{18}$ for the LPF circuit. These circuit elements $2_1$ to $2_{18}$ are connected as shown in FIG. 1.

The second switching transistor $2_2$ constitutes a second switch circuit, goes on when a second switch signal sent to the second-switch-signal supply terminal 10 has a positive polarity (high level), and goes off when the second switch signal has a ground potential (low level). The varactor diode $2_5$, the resonant inductor $2_9$, and the resonant capacitor $2_8$ and $2_{10}$, constitute a second resonant circuit for specifying the second oscillation frequency of the signal generated by the second voltage-controlled oscillating circuit 2. The resonant frequency of the second resonant circuit is set to a predetermined frequency in the 900 MHz band by changing a second frequency setting voltage sent to the varactor diode $2_5$ through the second-frequency-setting-voltage supply terminal 13. The inductor $2_{17}$ and the capacitor $2_{18}$ form a second LPF circuit for attenuating the first oscillation frequency of the signal generated by the first voltage-controlled oscillating circuit 1.

The coupling circuit 3 is formed of a first coupling capacitor $3_1$ and a second coupling capacitor $3_2$. The capacitors $3_1$ and $3_2$ are connected as shown in FIG. 1.

Figure 3:
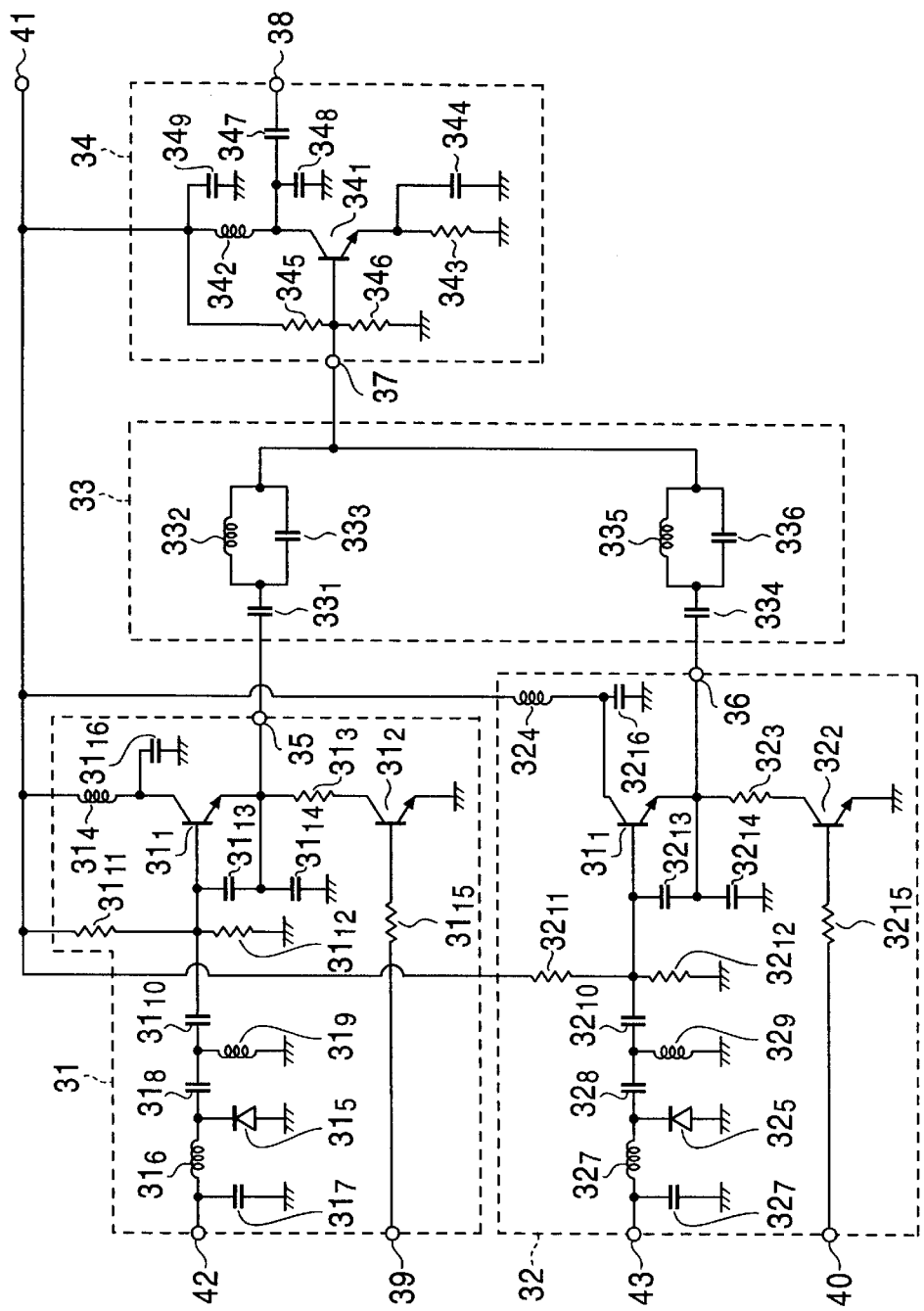
FIG. 3 is a circuit diagram of a known switch-type oscillating circuit.

The common circuit 4 is formed of an amplifying transistor $4_1$, a collector load inductor $4_2$, an emitter resistor $4_3$, a grounding capacitor $4_4$, base bias resistors $4_5$ and $4_6$, impedance-matching capacitors $4_7$ and $4_8$, and a bypass capacitor $4_9$. These circuit elements $4_1$ to $4_9$ are connected as shown in FIG. 1. The common circuit 4 has the same structure as the known common circuit 34 shown in FIG. 3.

The switch-type oscillating circuit having the above structure according to the first embodiment operates in the following way.

When the portable telephone is used for mobile communication in the DCS, a control section (not shown) sends a first switch signal having a positive polarity (high level) to the first-switch-signal supply terminal 9 and a second switch signal having a ground potential (low level) to the second-switch-signal supply terminal 10 to turn on the first switching transistor $1_2$ and to turn off the second switching transistor $2_2$. In the first voltage-controlled oscillating circuit 1, the emitter of the first oscillation transistor $1_1$ is connected to the ground through the collector-emitter path of the first switching transistor $1_2$, which is on, and through the inductor $1_{17}$ of the first LPF circuit and the emitter load resistor $1_3$, an operation current flows between the collector and the emitter of the first oscillation transistor $1_1$, and a normal oscillation operation is achieved. On the other hand, in the second voltage-controlled oscillating circuit 2, the emitter of the second oscillation transistor $2_1$ is made open in the DC and AC manners because the second switching transistor $2_2$ is off. Therefore, an operation current does not flow between the collector and the emitter of the second oscillation transistor $2_1$, and an oscillation operation is not achieved.

The first-frequency oscillation signal (oscillation signal having a frequency in the 1700 MHz band) obtained by the first oscillation transistor 11 is sent from the emitter thereof to the coupling circuit 3 through the collector-emitter path of the first switching transistor $1_2$ and the first-oscillation-signal output terminal 5, and then is sent to the common input terminal 7 of the common circuit 4 through the first coupling capacitor $3_1$ in the coupling circuit 3. Then, the first-frequency oscillation signal is amplified by the amplifying transistor $4_1$ of the common circuit 4, and the amplified first-frequency oscillation signal is sent through the signal output terminal 8 to a circuit (not shown) which uses the oscillation signal.

When the portable telephone is used for mobile communication in the GSM, the control section sends a first switch signal having the ground potential (low level) to the first-switch-signal supply terminal 9 and a second switch signal having the positive polarity (high level) to the second-switch-signal supply terminal 10 to turn off the first switching transistor $1_2$ and to turn on the second switching transistor $2_2$. In the second voltage-controlled oscillating circuit 2, the emitter of the second oscillation transistor $2_1$ is connected to the ground through the collector-emitter path of the second switching transistor $2_2$, which is on, and through the inductor $2_{17}$ of the second LPF circuit and the emitter load resistor $2_3$, an operation current flows between the collector and the emitter of the second oscillation transistor $2_1$, and a normal oscillation operation is achieved. On the other hand, in the first voltage-controlled oscillating circuit 1, the emitter of the first oscillation transistor $1_1$ is made open in the DC and AC manners because the first switching transistor $1_2$ is off. Therefore, an operation current does not flow between the collector and the emitter of the first oscillation transistor $1_1$, and an oscillation operation is not achieved.

The second-frequency oscillation signal (oscillation signal having a frequency in the 900 MHz band) obtained by the second oscillation transistor $2_1$ is sent from the emitter thereof to the coupling circuit 3 through the collector-emitter path of the second switching transistor $2_2$, which is on, and through the second-oscillation-signal output terminal 6, and then is sent to the common input terminal 7 of the common circuit 4 through the second coupling capacitor $3_2$ in the coupling circuit 3. Then, in the same way as described above, the second-frequency oscillation signal is amplified by the amplifying transistor $4_1$ of the common circuit 4, and the amplified second-frequency oscillation signal is sent through the signal output terminal 8 to a circuit (not shown) which uses the oscillation signal.

In the above operation, when the first-frequency oscillation signal is obtained at the output end (no symbol assigned in FIG. 1) of the coupling circuit 3 through the first coupling capacitor $3_1$, since the second LPF circuit for attenuating the first-frequency signal is disposed in a second path which is extended from the output end to a ground point through the second coupling capacitor $3_2$, the inductor $2_{17}$ of the second LPF circuit, and the parallel circuit of the capacitor $2_{18}$ of the second LPF circuit and the emitter load resistor $2_3$, the first-frequency oscillation signal which is sent from the output end of the coupling circuit 3 toward the second path is blocked by the second LPF circuit and does not reach the ground point. In the same way, when the second-frequency oscillation signal is obtained at the output end of the coupling circuit 3 through the second coupling capacitor $3_2$, since the first LPF circuit for attenuating the second-frequency signal is disposed in a first path which is extended from the output end to a ground point through the first coupling capacitor 31 the inductor $1_{17}$ of the first LPF circuit, and the parallel circuit of the capacitor $1_{18}$ of the first LPF circuit and the emitter load resistor $1_3$, the second-frequency oscillation signal which is sent from the output end of the coupling circuit 3 toward the first path is blocked by the first LPF circuit and does not reach the ground point.

As described above, in the switch-type oscillating circuit according to the first embodiment, the first switch signal and the second switch signal, which are complementary, are sent to selectively make the first voltage-controlled oscillating circuit 1 or the second voltage-controlled oscillating circuit 2 operate. The oscillation signal obtained by the operating voltage-controlled oscillating circuit is sent to the common circuit 4 through the coupling circuit 3. With the relatively simple circuit structure, sufficient isolation is provided between the first-frequency oscillation signal generated by the first voltage-controlled oscillating circuit 1 and the second-frequency oscillation signal generated by the second voltage-controlled oscillating circuit 2. In addition, the attenuation of the first-frequency oscillation signal and the second-frequency oscillation signal can be reduced.

Figure 2:
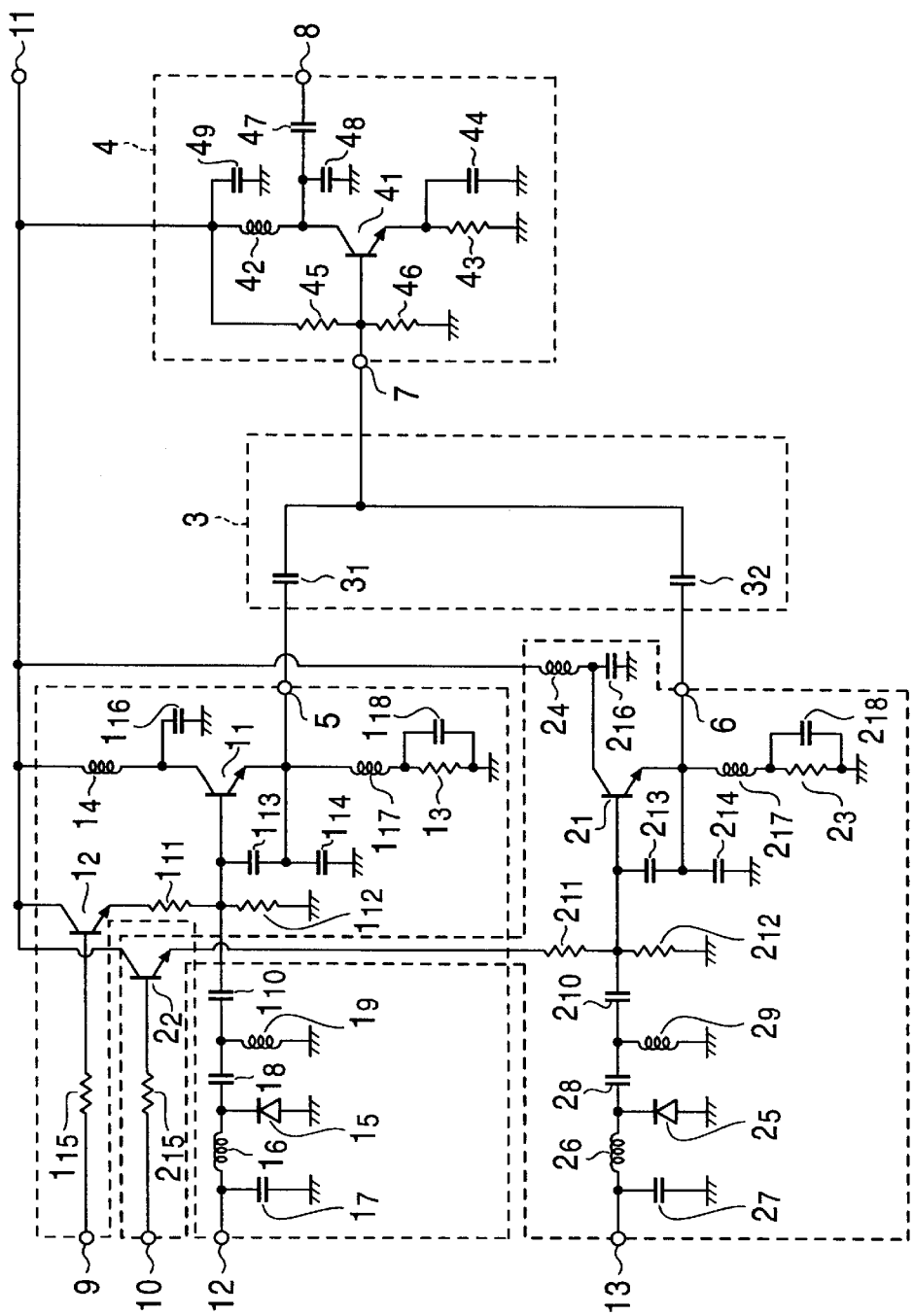
FIG. 2 is a circuit diagram of a switch-type oscillating circuit according to a second embodiment of the present invention.

FIG. 2 is a circuit diagram of a switch-type oscillating circuit according to a second embodiment of the present invention. The switch-type oscillating circuit is used for a portable telephone which can be used both in the DCS and the GSM in the same way as above.

In FIG. 2, the same symbols as those used in FIG. 1 are assigned to the same elements as those shown in FIG. 1.

The switch-type oscillating circuit according to the second embodiment has the same structure as the switch-type oscillating circuit according to the first embodiment except that the first switching transistor $1_2$ of the first voltage-controlled oscillating circuit 1 and the second switching transistor $2_2$ of the second voltage-controlled oscillating circuit 2 are disposed at different positions.

More specifically, in the first embodiment, the first switching transistor $1_2$ is connected between the emitter of the first oscillation transistor $1_1$ and the first-oscillation-signal output terminal 5, and the second switching transistor $2_2$ is connected between the emitter of the second oscillation transistor $2_1$ and the second-oscillation-signal output terminal 6. The two switching transistors $1_2$ and $2_2$ directly on-off-controls the collector-emitter currents of the corresponding two oscillation transistors $1_1$ and $2_1$. On the other hand, in the second embodiment, the first switching transistor $1_2$ is connected between the base bias resistor $1_{11}$ of the first oscillation transistor $1_1$ and the power terminal 11, and the second switching transistor $2_2$ is connected between the base bias resistor $2_{11}$ of the second oscillation transistor $2_1$ and the power terminal 11. The two switching transistors $1_2$ and $2_2$ on-off-controls the base bias voltages of the corresponding two oscillation transistors $1_1$ and $2_1$. As a result, the collector-emitter currents of the two oscillation transistors $1_1$ and $2_1$ are on-off-controlled.

In the second embodiment, the two switching transistors $1_2$ and $2_2$ turn on and off the supply of the base bias voltages to the corresponding two oscillation transistors $1_1$ and $2_1$ to on-off-control the collector-emitter currents of the two oscillation transistors $1_1$ and $2_1$. The operation in the second embodiment is essentially the same as that in the first embodiment. The advantages obtained in the second embodiment are almost the same as those obtained in the first embodiment.

Therefore, the structure, operation, and advantages of the second embodiment will not further be described.

In each of the above embodiments, the switch-type oscillation circuit is used for the portable telephone which can be used both in the DCS and the GSM, the oscillation signal output from the first voltage-controlled oscillating circuit has a frequency in the 1700 MHz band, and the oscillation signal output from the second voltage-controlled oscillating circuit 2 has a frequency in the 900 MHz. The use of a switch-type oscillating circuit according to the present invention is not limited to portable telephones. The circuit can also be used for similar units. The oscillation frequencies of signals output from the first voltage-controlled oscillation circuit 1 and the second voltage-controlled oscillation circuit 2 are not limited to those in the above-described frequency bands. They may be frequencies in other frequency bands if the oscillation frequency bands are appropriately apart.

In each of the above embodiments, the two oscillating circuits are the voltage-controlled oscillating circuits 1 and 2. Two oscillating circuits according to the present invention are not limited to voltage-controlled oscillating circuits. They can be oscillating circuits for generating oscillation signals in a fixed-frequency band.

What is claimed is:

1. A switch-type oscillating circuit comprising:
    a first oscillating circuit to output an oscillation signal having a first frequency, including a first oscillation transistor and a first switch circuit to switch the first oscillation transistor between an operating state and a non-operating state;
    a second oscillating circuit to output an oscillation signal having a second frequency, including a second oscillation transistor and a second switch circuit to switch the second oscillation transistor between an operating state and a non-operating state;
    a coupling circuit disposed between an output end of said first oscillating circuit and an output end of said second oscillating circuit, and an input end of a common circuit;
    a first low-pass filter circuit connected between the output end of said first oscillating circuit and a common potential point, to attenuate the oscillation signal having the second frequency; and
    a second low-pass filter circuit connected between the output end of said second oscillating circuit and the common potential point, to attenuate the oscillation signal having the first frequency.

2. A switch-type oscillating circuit according to claim 1, wherein the first switch circuit and the second switch circuit are connected to an output-current path of the first oscillation transistor and an output-current path of the second oscillation transistor.

3. A switch-type oscillating circuit according to claim 1, wherein the first switch circuit and the second switch circuit are connected to an emitter of the first oscillation transistor and an emitter of the second oscillation transistor.

* * * * *